United States Patent
Jiang et al.

(10) Patent No.: US 6,645,781 B1
(45) Date of Patent: Nov. 11, 2003

(54) METHOD TO DETERMINE A COMPLETE ETCH IN INTEGRATED DEVICES

(75) Inventors: Ping Jiang, Plano, TX (US); Heungsoo Park, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/135,291

(22) Filed: Apr. 29, 2002

(51) Int. Cl.[7] .............................................. H01L 21/66
(52) U.S. Cl. ............................. 438/14; 438/9; 438/15; 438/16; 438/17; 438/12
(58) Field of Search ........................ 438/9, 12, 14–17; 430/30; 257/103

(56) References Cited

U.S. PATENT DOCUMENTS

| | | | | |
|---|---|---|---|---|
| 5,148,461 A | * | 9/1992 | Shoulders | 378/119 |
| 5,171,992 A | * | 12/1992 | Clabes et al. | 250/306 |
| 5,585,211 A | * | 12/1996 | Firstein et al. | 430/30 |
| 5,616,926 A | * | 4/1997 | Shinada et al. | 250/423 F |
| 5,991,699 A | * | 11/1999 | Kulkarni et al. | 702/83 |
| 6,046,796 A | * | 4/2000 | Markle et al. | 356/72 |
| 6,180,497 B1 | * | 1/2001 | Sato et al. | 438/458 |
| 6,250,143 B1 | * | 6/2001 | Bindell et al. | 73/105 |
| 6,288,417 B1 | * | 9/2001 | Nickel et al. | 257/103 |
| 6,365,423 B1 | * | 4/2002 | Heinlein et al. | 438/14 |
| 6,433,561 B1 | * | 8/2002 | Satya et al. | 324/753 |
| 6,445,199 B1 | * | 9/2002 | Satya et al. | 324/753 |
| 6,509,197 B1 | * | 1/2003 | Satya et al. | 438/12 |

* cited by examiner

Primary Examiner—John F. Niebling
Assistant Examiner—Olivia Luk
(74) Attorney, Agent, or Firm—Jacqueline J. Garner; W. James Brady, III; Frederick J. Telecky, Jr.

(57) ABSTRACT

In an integrated device, an etch is performed in an intermediate layer to form a via. The via is inspected using a scanning electron microscopy. The scanning electron microscopy detects a level of brightness associated with the via and a background shade. Whether the etch reached an etch-stop layer is determined by comparing the level of brightness associated with the via to the background shade.

28 Claims, 3 Drawing Sheets

METHOD TO DETERMINE A COMPLETE ETCH IN INTEGRATED DEVICES

TECHNICAL FIELD OF THE INVENTION

The present invention relates generally to the field of electronic device processing and more particularly to a method to determine a complete etch in integrated devices.

BACKGROUND OF THE INVENTION

The use of vias and interconnects within a complex integrated electronic device is well known. Where interconnection is maintained, current may pass through the via from one semiconductor component to another within the integrated electronic device. During the formation of a via, an etch may be performed to form a cavity in a dielectric layer that separates semiconductor components. Additionally, a series of etches may be performed and each may be selective to a particular material or layer within the integrated device.

The ability to create complex integrated electronic devices at reasonable cost is directly related to the ability to determine accurately and quickly whether an etch is complete. Former techniques for determining complete etch include using physical failure analysis to determine the depth of the etch from a cross-sectional profile, or using an in-line probe to determine the electrical performance. Physical failure analysis is destructive to the wafer or the integrated device. Additionally, physical failure analysis is difficult and time consuming. The in-line probe is also time consuming as it may take several weeks to receive electrical results after an etch is performed. Neither technique allows for detection of incomplete etch defects during in-line production. Therefore, it is desirable to provide for immediate detection of an incomplete etch within integrated devices.

SUMMARY OF THE INVENTION

From the foregoing, it may be appreciated by those skilled in the art that a need has arisen to immediately determine whether a complete etch was made in an integrated device. In accordance with the present invention, a method for determining a complete etch in integrated devices is provided that substantially eliminates or greatly reduces at least some of the disadvantages and problems associated with previous semiconductor fabrication techniques and systems.

According to a particular embodiment of the present invention, a method for determining a complete etch in integrated devices is disclosed which includes performing an etch in an intermediate layer to form a via. The via is inspected using a scanning electron microscopy. The scanning electron microscopy detects a level of brightness associated with the via in relation to a background shade. Whether the etch reached an etch-stop layer is determined by comparing the level of brightness associated with the via to the background shade.

The present invention provides various technical advantages over conventional semiconductor fabrication techniques. In particular embodiments, a technical advantage may be that an incomplete etch may be detected more easily. Another technical advantage may be detection of an incomplete etch in an isolated Kelvin via. Further, process engineers may be able to detect an incomplete etch immediately during in-line production. Another technical advantage may be that whole lots of semiconductor wafers do not have to be set aside while a sample is examined by physical failure analysis, such as transmission electron microscopy (TEM). Consequently, process engineers may be able to fix the problem before subsequent defective lots are produced.

Another technical advantage may be that the method is not destructive to the wafer. Once a wafer is inspected with a complete etch, it may be returned to the lot and processing continued. Another technical advantage of particular embodiments may be that the method may be performed by automated tool setup so that engineers and technicians may better allocate their time and resources.

Embodiments of the present invention may have some, all, or none of the following technical advantages. Other technical advantages of the present invention may be readily apparent to one skilled in the art from the figures, description, and claims included herein.

BRIEF DESCRIPTION OF THE DRAWINGS

For a more complete understanding of the present invention and for further features and advantages thereof, reference is now made to the following description, taken in conjunction with the accompanying drawings, wherein like reference numerals represent like parts, in which.

DETAILED DESCRIPTION OF THE DRAWINGS

Figure 1A:
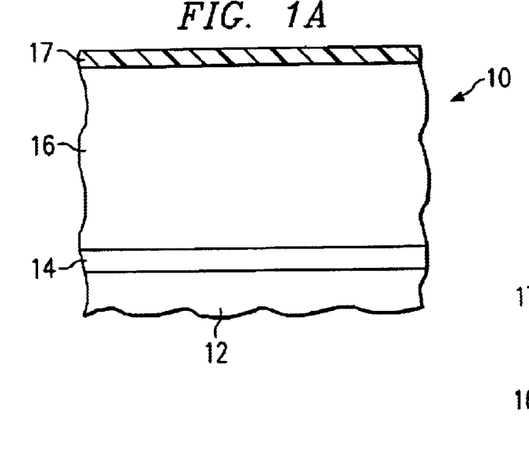
FIGS. 1A–1M illustrate one embodiment of an integrated device at different phases during the etching process.

FIG. 1A illustrates a cross-sectional sample 10 of an integrated device in accordance with one embodiment of the present invention. Cross-sectional sample 10 may include one or more layers deposited on an outer surface 11 of a substrate 12. For example, an etch-stop layer 14 may be deposited directly on the outer surface 11 of substrate 12. An intermediate layer 16 may then be deposited on the etch-stop layer 14. Subsequently, a cap layer 17 and photoresist layer may be deposited on the intermediate layer 16. Substrate 12 may be composed of copper, tungsten, tungsten silicate, or another appropriate conductive material commonly used in integrated devices.

Layers formed on substrate 12 may be deposited using conventional oxidation or deposition techniques. For example, chemical vapor deposition (CVD) is a common deposition technique used to form an etch-stop layer 14. In chemical vapor deposition, a chemical containing atoms of material to be deposited reacts with another reactant chemical leaving the product of the chemical reaction deposited on substrate 12. Chemical vapor deposition is conducted in a controlled environment known as a reaction chamber. Generally, the relative concentration of both the carrier chemical and the reactive chemical can be varied. Likewise, the temperature and pressure inside the reactant chamber can be varied and the time in which a substrate 12 is exposed to the chemical solution can be carefully controlled in order to achieve optimal conditions for the reaction given a desired thickness of the deposited material.

Etch-stop layer 14 typically includes silicon nitrate or silicon nitride, but other suitable etch-stop layers as known in the art, such as silicon carbide, may be used without departing from the scope of the present invention. The thickness of etch-stop layer 14 may be between 500 Å to 800 Å, but any appropriate thickness may be used without departing from the spirit and scope of the present invention.

As an alternative to chemical vapor deposition, etch-stop layer 14 may be deposited on substrate 12 using a variety of physical vapor deposition techniques. Additionally, the deposition technique used may include any other appropriate layer formation technique such as laser ablation.

After etch-stop layer 14 is deposited on the substrate 12, an intermediate layer 16 may be formed on the etch-stop layer 14. In particular embodiments, the intermediate layer 16 may be formed using a plasma-enhanced chemical vapor deposition (PECVD). A PECVD utilizes plasma to transfer energy to reactant gases and allows the gas flow compositions to be modulated in such a way that reactant gases are dispersed equally across the etch-stop layer 14. Intermediate layer 16 may also be formed, however, using a physical vapor deposition technique or by any appropriate technique known or available.

Intermediate layer 16 may include a layer of dielectric oxide, silicate glass, or other suitable semiconductor material. In particular embodiments, intermediate layer 16 may comprise fluorinated silicate glass, organosilicate glass, methyl silsequioxane (MSQ), hydrogen silsequioxane (HSQ), or other appropriate silicate polymer.

Prior to patterning the via, however, a cap layer 17 may be optionally deposited on the intermediate layer 16. The cap layer 17 may be formed using a PECVD, CVD as described above with regard to the formation of etch-stop layer 14, or by any appropriate technique known or available for depositing cap layer 17. The cap layer 17 may comprise silicon carbide, silicon nitride, or any other material appropriate for masking a sample 10 during the etching process. After cap layer 17 deposition, a bottom anti-reflection coating layer (BARC) and a photoresist layer may be coated and patterned over the sample 10, resulting in a via pattern over the intermediate layer 16. The BARC layer may be approximately 800 angstroms thick, where as the photoresist layer may be approximately 4000 angstroms thick. The described thickness of the BARC layer and the photoresist layer, however, are merely exemplary. The layers may be any appropriate thickness suitable for performing via patterning.

The cap layer 14 and the intermediate layer 16 may be anisotropically etched until a via cavity is formed extending downward toward the etch-stop layer 14. Anisotropic etch processes are typically performed using gases and plasma energy rather than acidic reaction. The plasma etch process requires a plasma chamber, a vacuum system, gas supply, and a power supply. Essentially, the sample 10 is introduced into a plasma chamber at a specified pressure and gas flow rates. The power supply creates a radio frequency field through electrodes in place in the chamber. The field energizes the reactive gas mixture to a plasma state containing energized ions and neutrals. The reactive ions and neutrals attack the surface from one direction, resulting in vertical etch profiles.

The present invention is not limited to anisotropic etch but may include isotropic etch such that etch occurs in all directions in approximately equal amounts. Isotropic etch can proceed in all directions at the same rate while anisotropic etch is, by definition, any etch that is not isotropic.

The etch process used to form a via (shown in FIG. 1B as reference numeral 18) in the intermediate layer 16 can be designed to be selective to the etch-stop layer 14. If, for example, the intermediate layer 16 includes fluorinated silicate glass and the etch-stop layer 14 includes silicon nitride, the etch process may be designed to be selective to fluorinated silicate glass relative to silicon nitride. In other words, the etch chemistry used to form via 18 will remove the fluorinated silicate glass within the intermediate layer 16 without substantially removing the silicon nitride etch-stop layer 14.

Figure 1B:
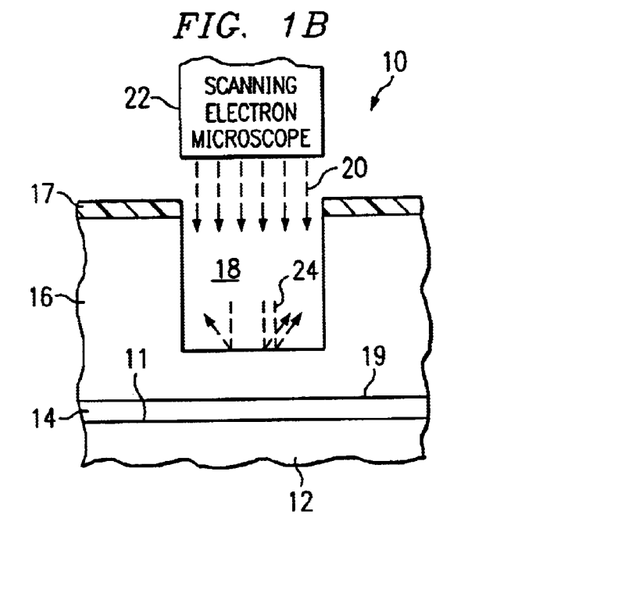

Whereas the via 18 may be formed to establish interconnection between two metal semiconductor components, the etch process may also be used to form a contact etch. The contact is similar to a via 18 in that it also is filled to allow interconnection between two semiconductor components. The contact, however, may be formed earlier in the production process and may be smaller than a via 18. The contact may be used to connect a first metal semiconductor component with a gate, or transistor. The contact etch process also uses an etch-stop layer 14. The etch-stop layer 14 may be silicon nitride or any other appropriate material for forming an etch-stop layer 14. The bottom of the contact may be filled with nickel silicide, cobalt silicide, or other appropriate conductive metal or metal silicide for completing interconnection between a first metal semiconductor component and a gate.

For formation of a complete etch, the etch process must completely remove a portion of intermediate layer 16 until the outer surface 19 of etch-stop layer 14 is exposed within the via 18. However, occasionally an incomplete etch may occur. FIG. 1B illustrates via 18 after a defective or incomplete initial via etch and resist strip. In the particular embodiment, the etch process has only removed a portion of intermediate layer 16 to a depth that is less than the entire depth of intermediate layer 16. Thus, the outer surface 19 of the etch-stop layer has not been exposed by the etch of via 18.

Previous techniques for determining the completeness of an etch included physical failure analysis or in-line probe analysis. For example, because a defective or incomplete etch may not be readily apparent during in-line production, a wafer may be sent to a lab for physical failure analysis using a transmission electron microscopy (TEM). Before TEM is performed on the wafer, a focus ion beam (FIB) may be used to extract a sample from the structure of the integrated device. A TEM transmits a beam of electrons through the sample. The electrons are affected by the structure of the sample. Because the wavelength of electrons are much smaller than that of light, the optimal resolution attainable for TEM images is many orders of magnitude better than that from a light microscope. Thus, TEMs may reveal the finest details of internal structure. These details may include whether an etch has removed a portion of the intermediate layer 16 to expose the outer surface of the etch-stop layer 14. TEM analysis is a precise technique that may detect very small defects or defects in very isolated vias.

A deficiency associated with performing a TEM analysis may be that the sample 10 is unusable after testing. Further, TEM analysis along with FIB technique is time consuming. The typical turnaround time for a TEM lab may be approximately seven to ten days. During the lapse of time between taking a TEM sample and receiving TEM results, production of integrated circuits may continue. A subsequent finding that the etch was incomplete calls into question the completeness of every integrated device produced during the lapse of time.

Accordingly, a technique that allows immediate detection of an incomplete etch during in-line production is desirable. FIG. 1B illustrates directing electrons 20 into the via 18 using a scanning electron microscopy 22 (SEM) to determine whether the etch is complete. A SEM 22 is similar to a TEM in that the SEM 22 uses electrons rather than light to form an image. The beam of electrons 20 is produced at the top of the microscope by an electron gun. The electrons are attracted to a heated metallic filament within the SEM 22. The electron beam 20 follows a vertical path through a series of electromagnetic lenses that focus and direct the beam 20 down towards the sample 10. Once it hits the sample 10, primary and secondary backscattered electrons 24 are deflected off of the sample 10. Detectors collect the backscattered electrons 24 and convert them to an image that is sent to a viewing screen. The SEM 22 is designed for direct studying of solid objects. By scanning with an electron beam 20 that has been generated and focused by the operation of the SEM 22, an image is formed of a greater depth of focus than an optical microscope.

SEM 22 inspection to detect incomplete etch in via 18 of sample 10 may be advantageous over TEM analysis since it is non-destructive to the sample 10. Additionally, a SEM 22 is an in-line measurement/inspection tool that is already a component of many wafer fabrication lines. As a result, SEM 22 analysis may be less costly and less time-consuming. The results of a SEM 22 inspection may be immediately known and defects cured before further production of integrated devices. Although SEM 22 inspection is described as being performed after a defective or incomplete via etch and resist strip, the SEM 22 inspection may also be performed after a via etch and prior to a resist strip. The results of a SEM 22 inspection in either scenario are substantially similar.

Figure 1C:
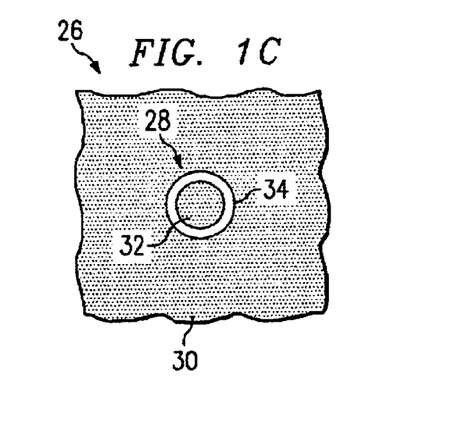

FIG. 1C illustrates an image 26 representing an incomplete etch as detected by the SEM 22 after a defective initial via etch. The SEM image 26 reflects a level of brightness 28 associated with the via 18 that is surrounded by a background shade 30. In particular embodiments, the level of brightness 28 associated with via 18 may include a center core portion 32 and an outlining portion 34 that is adjacent to the center core portion 32. The outlining portion 34 represents the via slope and top corner rounding. A technician may determine whether the etch is complete by comparing the level of brightness 28 of the center core portion 32 to the background shade 30. If the level of brightness 28 of the center core portion 32 is not substantially different from the background shade 30, as is illustrated in FIG. 1C, the technician may determine that the etch is not complete. The technician may deduce that a problem exists in the etching process and take appropriate steps to modify the etching process such that a complete etch is produced. Thus, a technical advantage may be that SEM analysis of sample 10 may provide for immediate detection of an incomplete etch. Production of the integrated devices may be stopped until the etching process is modified.

In particular embodiments, the SEM analysis may be automated. Thus, the transmission of the electron beam 20 may be entirely directed by a computing device or other machine. Additionally, the computing device may receive the SEM image 26 and compare the level of brightness 28 of the center core portion 32 to the background shade 30. The computing device may analyze the image 26 produced by the SEM 22 to determine if the difference between the level of brightness 28 of the center core portion 32 and the background shade 30 is less than a predetermined amount. The predetermined amount may be a threshold percentage that indicates that further analysis may be necessary. Alternatively or additionally, the predetermined amount may be a threshold amount that indicates that the etching process is defective. In particular embodiments, the predetermined amount may be at least fifteen percent. Thus, a center core portion 32 that is at least fifteen percent brighter than the background shade 30 may indicate a complete etch. Fifteen percent, however, is merely exemplary. The predetermined amount may be set to any percentage value or range that is appropriate for detecting a defect in the etching process.

Figure 1D:
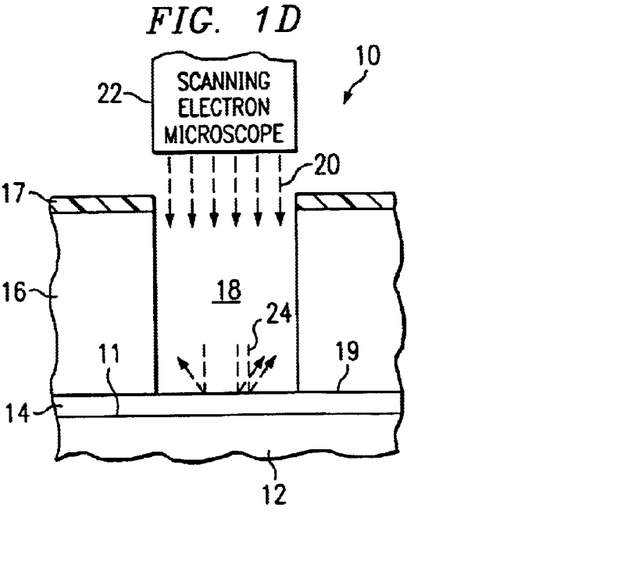

FIG. 1D illustrates directing electrons into a via of an integrated device after a non-defective complete initial via etch. In other words, the etch process has completely removed a portion of the intermediate layer 16 until the outer surface 19 of etch-stop layer 14 is exposed within the via 18. Because the completeness of the etch may not be readily ascertainable, a SEM may be used to determine whether the etch has exposed outer surface 19. In this embodiment, the operation of the SEM 22 may be as previously described in connection with FIG. 1B.

Figure 1E:
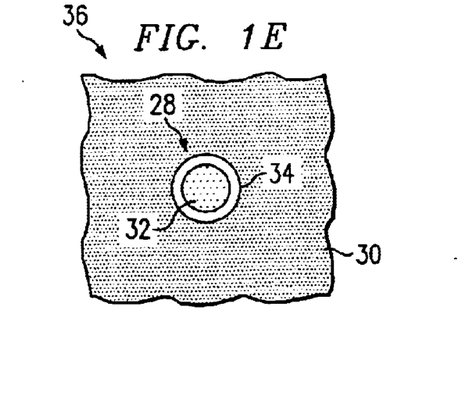

FIG. 1E illustrates an image 36 as detected by the SEM 22 after an initial complete etch. In this embodiment, a technician may determine that the etch is not defective and is in fact complete by comparing the level of brightness 28 of the center core portion 32 to the background shade 30. Since the level of brightness 28 of the center core portion 32 is substantially different from the background shade 30, it may be determined that the etch is complete. Accordingly, a technical advantage may be that SEM analysis of sample 10 may also provide for immediate detection of a complete etch. Production of the integrated devices may be continued in the same manner as performed on sample 10.

A second etch may be performed on sample 10 to selectively etch the etch-stop layer 14 relative to the material of substrate 12. If, for example, the etch-stop layer 14 includes silicon nitride and the material of the substrate 12 includes copper, the etch process may be selective to silicon nitride relative to copper. In other words, the etch chemistry used to further form via 18 will remove the silicon nitride etch-stop layer 14 without substantially removing the copper forming substrate 12.

Figure 1F:
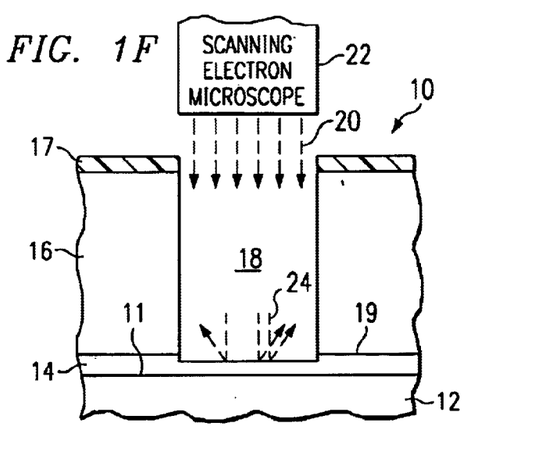

For formation of a complete second etch, the etch process must extend completely through the etch-stop layer 14 until the outer surface 11 of the substrate 12 is exposed within the via 18. Similar to defects in the initial via etch process, occasionally an incomplete etch of the etch-stop layer 14 can occur. FIG. 1F illustrates a via 18 after a defective or incomplete second etch-stop layer 14 etch. In the particular embodiment, the etch process has only removed a portion of the etch-stop layer 14 to a depth that is less than the entire depth of the etch-stop layer 14. Thus, the outer surface 11 of the substrate 12 has not been exposed by the etch of via 18.

Figure 1G:
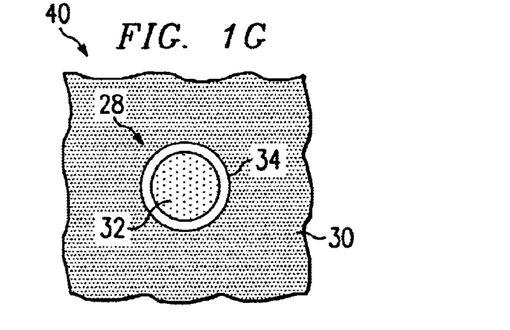

A SEM 22 inspection performed after an incomplete etch-stop etch may not provide reliable detection of the defect. FIG. 1G illustrates an image 40 as detected by the SEM 22 after an incomplete second etch selective to the etch-stop layer 14. In this embodiment, the background shade 30 and the level of brightness 28 associated with the via 18, including the center core portion 32 and the outlining portion 34, may be as previously described in connection with FIG. 1C. The level of brightness 28 of the center core portion 32 is substantially different from the background shade 30. Thus, image 40 shows a center core portion 32 that is brighter than background shade 32. Because this image may be similar to the image produced by SEM analysis after a complete initial via etch as well as after a complete second etch, the results of the SEM analysis are inconclusive at this stage.

Accordingly, a third etch may be performed to determine whether the second etch-stop etch was defective. The third etch may include a wet etch selective to the material of the substrate 12. A wet etch involves immersing the sample 10 in a tank of a chemical etchant for a specific time resulting in the dissolution of the desired material to be etched. Different etchants can be used for different materials and in different circumstances in order to achieve a desired amount of etch. A wet etch is an isotropic etch. As described above in connection with FIG. 1A, isotropic etch removes material in all directions in approximately equal amounts resulting in an etch pattern that is not substantially vertical. Rather, the wet etch removes material both horizontally and vertically. The wet etch may be composed of piranha solution, ammonium hydrogen—hydrogen peroxide solution, or any other appropriate wet etch material commonly used on integrated devices to remove copper without removing dielectric material.

The third wet etch process is selective to the material of the substrate 12 relative to the etch-stop layer 14, the intermediate layer 16, and the cap layer 17. If, for example, the material of the substrate 12 includes copper, etch-stop layer 14 and the cap layer 17 include silicon nitride, and the intermediate layer 16 include organosilicate glass, the third wet etch process may be selective to copper relative to silicon nitride and organosilicate glass. In other words, the wet etch chemistry will not remove the silicon nitride and organosilicate glass substantially before removing the copper forming substrate 12.

Figure 1H:
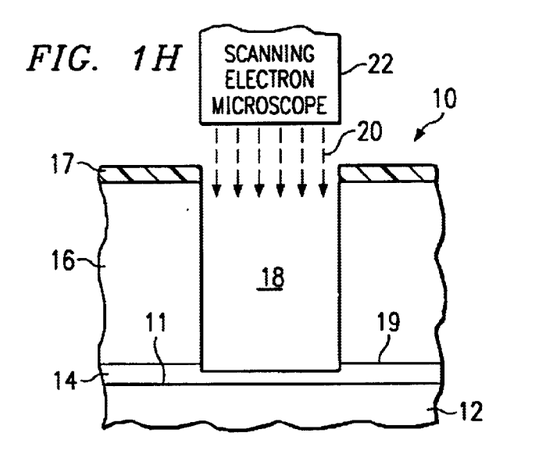

FIG. 1H illustrates the sample 10 after a third wet etch is performed subsequent to a defective or incomplete second etch selective to the etch-stop layer 14. Because the etch process has only removed a portion of the etch-stop layer 14 to a depth that is less than the entire depth of the etch-stop layer 14, the outer surface 11 of the substrate 12 is not exposed by the second etch-stop etch of via 18. Accordingly, a wet etch selective to the material of the substrate 12 relative to the other layers of the sample 10 will not affect the substrate 12.

Because the successfulness of the third wet etch may not be readily ascertainable, a SEM 22 may be used to determine whether the wet etch has penetrated substrate 12. In this embodiment, the operation of the SEM 22 may be as previously described in connection with FIG. 1B.

Figure 1I:
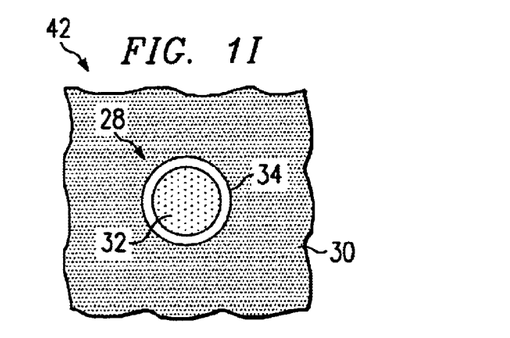

FIG. 1I illustrates an image 42 as produced by the SEM 22 after a third wet etch does not penetrate beyond etch-stop layer 14. The anticipated results of a SEM analysis after the third wet etch are opposite to the results expected after initial via etch or a second stop layer etch. Thus, a technician, computing device, or automated machine may determine that the third wet etch did not penetrate substrate 12 by comparing the level of brightness 28 of the center core portion 32 to the background shade 30. If the level of brightness 28 of the center core portion 32 is substantially different from the background shade 30, as is illustrated in FIG. 1I, it may be determined that the third wet etch has not penetrated beyond etch-stop layer 14. Put differently, if the center core portion 32 is substantially brighter than the background shade 30, the third wet etch may not have penetrated beyond etch-stop layer 14.

Because image 42 is not what would typically be expected after an effective wet etch, image 42 may indicate that a problem exists in the initial via etch process or the subsequent etch-stop etch process and that steps may be taken to modify the etching processes to produce a complete initial via etch or etch-stop etch as is appropriate. Accordingly, production of the integrated devices may be stopped until the appropriate steps are taken.

Figure 1J:
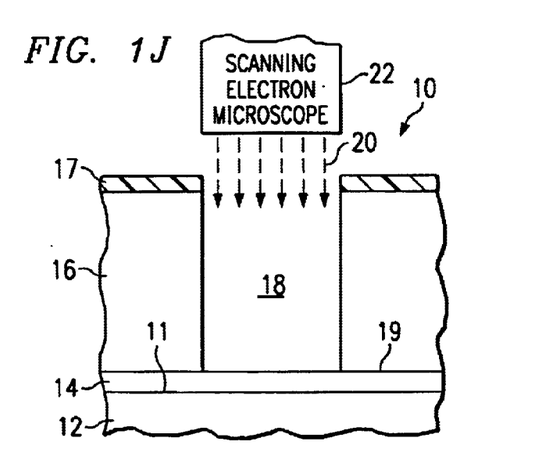

FIG. 1J illustrates directing electrons into a via 18 of an integrated device after a non-defective complete second etch. In other words, the second etch process has completely removed a portion of etch-stop layer 14 until the outer surface 11 of the substrate 12 is exposed within the via 18. As previously described with regard to FIGS. 1F and 1G, a SEM 22 analysis performed after an incomplete etch-stop etch may not provide reliable detection of the defect.

Figure 1K:
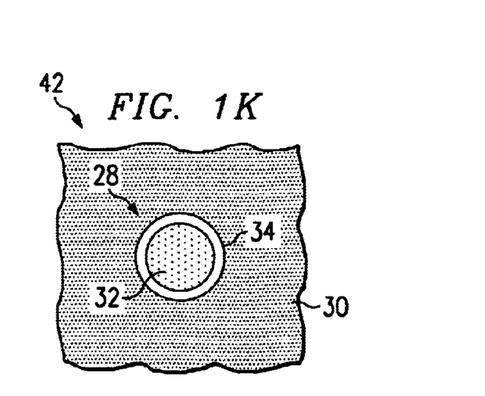

The image 42 detected by the SEM 22 at this stage is illustrated in FIG. 1K. The level of brightness 28 of the center core portion 32 is substantially different from the background shade 30. Thus, image 40 shows a center core portion 32 that is brighter than background shade 32. Because this image 42 may be similar to the image 40 produced by SEM analysis after an incomplete second etch, as depicted in FIG. 1G, the results of the SEM analysis are inconclusive at this stage.

Figure 1L:
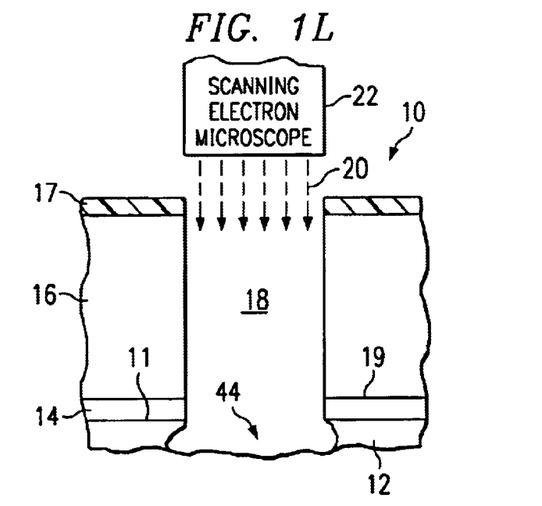

FIG. 1L illustrates a sample 10 after a third wet etch is performed subsequent to a non-defective or complete second etch. Because the second etch process has completely removed a portion of the etch-stop layer 14, the outer surface 11 of substrate 12 was exposed within via 18. Accordingly, a third wet etch selective to the material of the substrate 12 relative to the other layers of the sample 10 will remove a portion 44 of the substrate 12 to produce the cross-sectional profile illustrated in FIG. 1L. Because penetration of substrate 12 and removal of portion 44 may not be readily ascertainable, a SEM 22 may be used to determine whether the wet etch has successfully penetrated substrate 12. In this embodiment, the operation of the SEM 22 may be as previously described in connection with FIG. 1B.

Figure 1M:
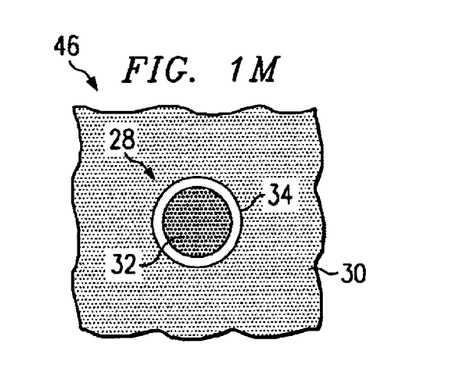

FIG. 1M illustrates an image 46 as produced by the SEM 22 after the third wet etch is performed on the sample 10 illustrated in FIG. 1L. As described previously, the anticipated results of a SEM analysis after the third wet etch are opposite to the results expected after the initial via etch or the second stop layer etch. If the level of brightness 28 of the center core portion 32 is not substantially different from the background shade 30, as is illustrated in FIG. 1M, it may be determined that the third wet etch has penetrated the substrate 12. Put differently, if the center core portion 32 is as dark as or substantially darker than the background shade 30, the wet etch has penetrated the substrate 12 to remove portion 44. This allows for a determination that the second etch successfully etched away etch-stop layer 14 and no adjustments need to be made to the second etch process. Thus, image 46 indicates that production of the integrated devices may be continued in the same manner as performed on sample 10.

Figure 2A:
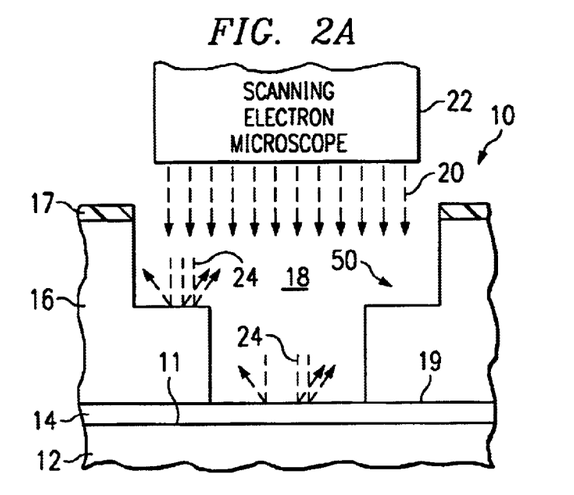
FIG. 2A–B illustrates a cross-sectional sample formed in a dual damascene configuration and an image representing a complete etch as detected by a scanning electron microscopy after a dual damascene etch.

In particular embodiments, interconnects and vias may be formed using modified integration techniques to form dual damascene configurations. FIG. 2A illustrates a cross-sectional sample 10 formed in a dual damascene configuration. The dual damascene process includes the formation of via 18 through intermediate layer 16 that may include multiple layers of different materials with different etch properties. The intermediate layer 16 in a dual damascene configuration may be substantially thicker than the intermediate layer 16 of a single damascene configuration.

A via 18 is etched through the full intermediate layer 16. After formation of the via 18, the resist may be stripped from the surface of the via 18, and a SEM 22 inspection may be performed to determine whether or not the via etch is complete. A SEM 22 inspection performed after the via etch but before further processing of the sample 10 may render results substantially similar to that of a SEM 22 inspection performed after the via etch in a single damascene configuration.

Accordingly, SEM 22 inspection after a defective initial via etch of a dual damascene configuration may result in an image that is substantially similar to image 26 of FIG. 1C. If the level of brightness 28 of the center core portion 32 is not substantially different from the background shade 30, as is illustrated in FIG. 1C, the technician may determine that the etch is not complete. The technician may take appropriate steps to modify the etching process such that a complete etch is produced.

By contrast, if SEM 22 inspection is performed after a non-defective complete initial via etch of the dual damascene configuration, the resulting image may be substantially similar to FIG. 1E. If the level of brightness 28 of the center core portion 32 is substantially different from the background shade 30, it may be determined that the etch is complete. Therefore, adjustment of the production process may be unneccessary.

Although SEM 22 inspection may be performed after the initial etch of via 18, SEM 22 inspection may also be performed after further formation of the dual damascene configuration. To further form dual damascene configuration, a BARC layer may be used for trench pattern. The BARC layer may be coated over the surface of the via 18 as well as the etch-stop layer 14. The BARC layer may act as a protectant of the etch-stop layer 14 while a trench 50 is partially etched into the intermediate layer 16. Trench 50 may be formed with or without the use of a stopping layer. The etch process may be controlled by limiting the time that the sample 10 is exposed to the etching materials according to known etch rates for particular etch processes. Following formation of the trench 50, a clean may be performed on the dual damascene configuration. The clean may remove the resist layer and BARC layer as well as any debris remaining on the sample 10 from the etching process.

In the example embodiment depicted in FIG. 2A, the via etch process has completely removed a portion of the intermediate layer 16 such that the outer surface 19 of the etch-stop layer 14 is exposed at the bottom of the via 18. Therefore, the via etch is non-defective or complete. Additionally, trench 50 has been performed and resist stripped. Because the completeness of the etch may not be readily ascertainable, a SEM 22 may also be used at this point during production of the sample 10 to determine whether the via etch has exposed outer surface 19. In this embodiment, the operation of the SEM 22 may be as previously described in connection with FIG. 1B.

Figure 2B:
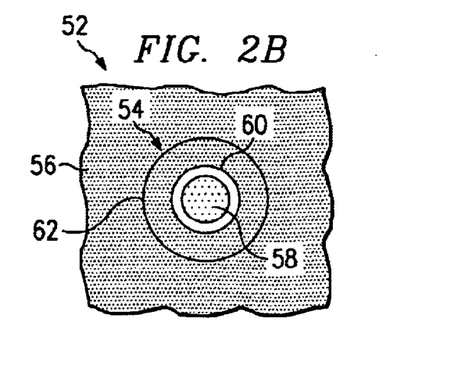

FIG. 2B illustrates an image 52 representing a complete etch as detected by scanning electron microscopy after the formation of a non-defective via 18 and trench 50. The SEM image 52 reflects a level of brightness 54 associated with via 18 surrounded by a background shade 56. In particular embodiments, the level of brightness 54 associated with the via may comprise a center core portion 58 and an outlining portion 60 that is adjacent to the center core portion 58. The outlining portion 60 may define the sidewalls of the inner trench 48. The level of brightness 54 may also include an outer ring 62 that defines the sidewalls of the outer trench 50. A technician, computing device, or automated machine may then determine whether the etch is complete by comparing the level of brightness 54 of the center core portion 58 to the background shade 56. If the level of brightness 54 of the center core portion 58 is substantially different from the background shade 56, as is illustrated in FIG. 2B, it may be determined that the etch is complete. Production of the integrated devices may be continued in the same manner as performed on sample 10.

If, however, the via etch had not completely removed a portion of the intermediate layer 16 to expose outer surface 19 of the etch-stop layer 14 within the via 18, the etch process may be defective or incomplete. The image produced by SEM analysis may instead show the level of brightness 54 of the center core portion 58 as not substantially different from the background shade 56, similar to FIG. 1B. Accordingly, it may be determined that the via etch is not complete and that a problem exists in the etching process. Appropriate steps may then be taken to modify the etching process such that a complete etch is produced. Production of the integrated devices may be stopped until the etching process is modified. Thus, a technical advantage may be that SEM analysis of sample 10 may provide for immediate detection of an incomplete etch within dual damascene configurations.

Following the formation of a via 18 and trench 50 in a dual damascene configuration, a second etch may be performed to selectively etch the etch-stop layer 14 relative to the material of the substrate 12. The second etch may be performed as was described with regard to FIG. 1E and the single damascene configuration. For formation of a complete second etch, the etch process must extend completely through the etch-stop layer 14 until the outer surface 11 of the substrate 12 is exposed within the via 18. As was described above with regard to single damascene configurations, performance of a SEM 22 inspection after the second etch may not provide reliable detection of a defect in the second etch.

Accordingly, a third etch may be performed to determine whether the second etch-stop etch was defective. The third etch may be performed as was described with regard to FIG. 1G. The third wet etch process may be selective to the material of the substrate 12 relative to the etch-stop layer 14, the intermediate layer 16, and the cap layer 17. Because the successfulness of the third wet etch may not be readily ascertainable, a SEM 22 inspection may be performed to determine whether the wet etch has penetrated substrate 12. The anticipated results of a SEM 22 analysis after the third wet etch are opposite to the results expected after the formation of via 18 or trench 50. Where the third wet etch has not penetrated the substrate 12, a SEM 22 inspection may result in an image illustrating a level of brightness that is substantially similar to the level of brightness 28 of FIG. 1I or FIG. 1K. Thus, the level of brightness 28 of the center core portion 32 may be substantially different than the background shade 30. Thus, it may be determined that the second etch-stop etch is not complete. By contrast, where the third wet etch has penetrated and removed a portion of the substrate layer 12, SEM 22 inspection may result in an image illustrating a level of brightness 28 that is substantially similar to the level of brightness 28 of FIG. 1M. Thus, it may be determined that the second etch-stop etch is complete.

Although the present invention has been described with several embodiments, numerous changes, substitutions, variations, alterations, transformations, and modifications may be made by one skilled in the art, and it is intended that the present invention encompass all such changes, substitutions, variations, alterations, transformations, and modifications as fall within the spirit and scope of the appended claims.

What is claimed is:

1. A method for determining a complete etch in integrated devices, comprising:
   performing an etch in an intermediate layer to form a via;
   inspecting the via using a scanning electron microscopy, the scanning electron microscopy detecting a level of brightness associated with the via and a background shade; and determining whether the etch reached an etch-stop layer by comparing the level of brightness associated with the via to the background shade.

2. The method of claim 1, further comprising:
determining that an incomplete etch does not exist if the level of brightness is substantially different from the background shade.

3. The method of claim 2, wherein determining that the incomplete etch does not exist indicates that the via has been formed through substantially all of the intermediate layer to expose an outer surface of the etch-stop layer.

4. The method of claim 1, further comprising:
determining that an incomplete etch does not exist if the difference between the level of brightness associated with the via and the background shade is greater than a predetermined amount.

5. The method of claim 4, wherein the predetermined amount is at least fifteen percent.

6. The method of claim 1, further comprising:
determining that an incomplete etch does exist if the level of brightness associated with the via is not substantially different from the background shade.

7. The method of claim 6, wherein determining that the incomplete etch does exist indicates that the via has not been formed through substantially all of the intermediate layer.

8. The method of claim 1, further comprising:
determining that an incomplete etch does exist if the difference between the level of brightness associated with the via and the background shade is less than a predetermined amount.

9. The method of claim 8, wherein the predetermined amount is at least fifteen percent.

10. The method of claim 1, wherein performing the etch includes forming a single damascene via, the level of brightness associated with the via comprising:
a center core portion; and
an outlining portion adjacent to the center core portion.

11. The method of claim 1, wherein performing the etch includes forming a dual damascene configuration, the dual damascene configuration including a via and a trench, the level of brightness associated with the dual damascene configuration comprising:
a center core portion;
an outlining portion adjacent to the center core portion, the outlining portion corresponding to the via; and
an outer ring portion corresponding to the trench.

12. The method of claim 1, further comprising:
performing a second etch to extend the via through an etch-stop layer.

13. The method of claim 1, further comprising:
performing a second etch to extend the via through the etch-stop layer;
performing a third etch to determine if the second etch is complete, the third etch including a wet etch that is selective to a material below the etch-stop layer;
inspecting the via using the scanning electron microscopy after the third etch to verify that the wet etch has penetrated the material below the etch-stop layer.

14. The method of claim 13, further comprising:
determining that an incomplete second etch does not exist if the difference between the level of brightness associated with the via and the background shade is greater than a predetermined amount.

15. The method of claim 13, further comprising:
determining that an incomplete second etch does exist if the level of brightness associated with the via is not substantially different from the background shade.

16. A method for determining a complete etch in integrated devices comprising:
performing an etch in the intermediate layer to form a via;
inspecting the via using an scanning electron microscopy, the scanning electron microscopy detecting a level of brightness associated with the via and a background shade;
comparing the level of brightness associated with the via to the background shade;
determining that an incomplete etch does not exist if the level of brightness associated with the via is substantially different from the background shade indicating that the etch has reached an underlying etch-stop layer; and
determining that the incomplete etch does exist if the level of brightness associated with the via is not substantially different from the background shade.

17. The method of claim 16, wherein determining that the incomplete etch does not exist indicates that the via has been formed through substantially all of the intermediate layer.

18. The method of claim 16, further comprising determining that the incomplete etch does not exist if the difference between the level of brightness associated with the via and the background shade is at least fifteen percent.

19. The method of claim 16, wherein determining that the incomplete etch does exist indicates that the via has not been formed through substantially all of the intermediate layer to expose an outer surface of the etch-stop layer.

20. The method of claim 16, further comprising determining that the incomplete etch does exist if the difference between the level of brightness associated with the via and the background shade is at least fifteen percent.

21. The method of claim 16, wherein performing the etch includes forming a single damascene via, the level of brightness associated with the via comprising:
a center core portion; and
an outlining portion adjacent to the center core portion.

22. The method of claim 16, wherein performing the etch includes forming a dual damascene configuration, the dual damascene configuration including a via and a trench, the level of brightness associated with the dual damascene configuration comprising:
a center core portion;
an outlining portion adjacent to the center core portion, the outlining portion corresponding to the via; and
an outer ring portion corresponding to the trench.

23. The method of claim 16, further comprising:
performing a second etch to extend the via through an etch-stop layer.

24. The method of claim 16, further comprising:
performing a second etch to extend the via through an etch-stop layer;
performing a third etch to determine if the second etch is complete, the third etch including a wet etch that is selective to a material below the etch-stop layer;
inspecting the via using the scanning electron microscopy after the third etch to verify that the wet etch has penetrated the material below the etch-stop layer.

25. The method of claim 24, further comprising:
determining that an incomplete second etch does not exist if the difference between the level of brightness associated with the via and the background shade is greater than a predetermined amount.

26. The method of claim 24, further comprising:
determining that an incomplete second etch does exist if the level of brightness associated with the via is not substantially different from the background shade.

27. A method for determining a complete etch in integrated devices, comprising:
performing an etch in an intermediate layer to form a contact;
inspecting the contact using a scanning electron microscopy, the scanning electron microscopy detecting a level of brightness associated with the contact and a background shade; and
determining whether the etch reached an etch-stop layer by comparing the level of brightness associated with the contact to the background shade.

28. A method for determining a complete etch in integrated devices, comprising:
performing a first etch in an intermediate layer to form a via;
inspecting the via using an scanning electron microscopy to determine whether an incomplete etch exists in the first etch by comparing a level of brightness associated with the via with a background shade;
performing a second etch to extend the via through an etch-stop layer in response to the brightness associated with the via being greater than the background shade by a predetermined threshold value;
performing a third etch to verify the completeness of the second etch, the third etch including a wet etch selective to a material below the etch-stop layer; and
inspecting the via to determine whether an incomplete second etch exists by comparing a level of brightness associated with the via to the background shade, the second etch being successfully completed upon verifying that the brightness associated with the via is substantially similar to the background shade.

* * * * *